US009240248B2

(12) United States Patent
Rategh et al.

(10) Patent No.: US 9,240,248 B2
(45) Date of Patent: *Jan. 19, 2016

(54) METHOD OF USING NON-VOLATILE MEMORIES FOR ON-DIMM MEMORY ADDRESS LIST STORAGE

(71) Applicant: INPHI CORPORATION, Santa Clara, CA (US)

(72) Inventors: Hamid Reza Rategh, Santa Clara, CA (US); David T. Wang, Santa Clara, CA (US); Lawrence Tse, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/473,872

(22) Filed: Aug. 29, 2014

(65) Prior Publication Data

US 2015/0016192 A1 Jan. 15, 2015

Related U.S. Application Data

(63) Continuation of application No. 13/791,814, filed on Mar. 8, 2013, now Pat. No. 8,861,277.

(60) Provisional application No. 61/664,304, filed on Jun. 26, 2012.

(51) Int. Cl.
*G11C 11/34* (2006.01)
*G11C 29/04* (2006.01)
(Continued)

(52) U.S. Cl.
CPC ........ *G11C 29/04* (2013.01); *G11C 5/04* (2013.01); *G11C 7/1012* (2013.01); *G11C 8/06* (2013.01);
(Continued)

(58) Field of Classification Search
CPC ........... G11C 29/04; G11C 16/08; G11C 8/06
USPC ................................ 365/185.18, 189.05, 200
See application file for complete search history.

(56) References Cited

U.S. PATENT DOCUMENTS 5,592,612 A   1/1997   Birk
6,128,094 A   10/2000  Smith
(Continued)

OTHER PUBLICATIONS

Office Action for U.S. Appl. No. 13/653,373, dated Mar. 27, 2014.
(Continued)

*Primary Examiner* — Fernando Hidalgo
(74) *Attorney, Agent, or Firm* — Richard T. Ogawa; Ogawa P.C.

(57) ABSTRACT

An integrated circuit device. The device includes an address input(s) configured to receive address information from an address stream from an address command bus coupled to a host controller and an address output(s) configured to drive address information, and is coupled to a plurality of memory (DRAM) devices provided on a DIMM. The device has an address match table comprising a non-volatile memory device configured to store at least a revised address corresponding to a spare memory location and a bad address of at least one of the plurality of memory (DRAM) devices. The device has a control module configured to process and determine whether each address matches with a stored address in the address match table to identify the bad address and configured to replace the bad address with the revised address of the spare memory location.

14 Claims, 16 Drawing Sheets

(51) Int. Cl.

| | |
|---|---|
| *G11C 8/06* | (2006.01) |
| *G11C 5/04* | (2006.01) |
| *G11C 29/44* | (2006.01) |
| *G11C 7/10* | (2006.01) |
| *G11C 11/413* | (2006.01) |
| *G11C 16/08* | (2006.01) |
| *G11C 29/00* | (2006.01) |
| *G11C 29/08* | (2006.01) |

(52) U.S. Cl.
CPC ............. *G11C 11/413* (2013.01); *G11C 16/08* (2013.01); *G11C 29/44* (2013.01); *G11C 29/76* (2013.01); *G11C 29/785* (2013.01); *G11C 29/08* (2013.01); *G11C 2029/4402* (2013.01)

(56) References Cited

U.S. PATENT DOCUMENTS

| | | | |
|---|---|---|---|
| 6,400,621 | B2 | 6/2002 | Hidaka et al. |
| 6,542,956 | B1 | 4/2003 | Lee et al. |
| 6,993,701 | B2 | 1/2006 | Corbett et al. |
| 7,656,727 | B2 | 2/2010 | Thayer |
| 7,990,746 | B2 | 8/2011 | Rajan |
| 8,325,554 | B2 | 12/2012 | Sweere et al. |
| 8,687,451 | B2 | 4/2014 | Wang |
| 2004/0123029 | A1 | 6/2004 | Dalal et al. |
| 2006/0200697 | A1 | 9/2006 | Ito |
| 2008/0104290 | A1 | 5/2008 | Cowell et al. |
| 2008/0183959 | A1 | 7/2008 | Pelley et al. |
| 2009/0141558 | A1 | 6/2009 | Sarin et al. |
| 2009/0300259 | A1 | 12/2009 | Luo et al. |
| 2010/0005212 | A1 | 1/2010 | Gower et al. |
| 2010/0162037 | A1 | 6/2010 | Maule et al. |
| 2010/0199125 | A1 | 8/2010 | Reche |
| 2010/0274952 | A1* | 10/2010 | Lee .............................. 711/103 |
| 2011/0072200 | A1 | 3/2011 | Lee et al. |
| 2011/0125990 | A1 | 5/2011 | Khosravi et al. |
| 2011/0170329 | A1 | 7/2011 | Kang |
| 2012/0151294 | A1* | 6/2012 | Yoo et al. ...................... 714/755 |
| 2012/0243299 | A1 | 9/2012 | Shau |
| 2012/0257459 | A1 | 10/2012 | Berke |
| 2012/0297231 | A1 | 11/2012 | Qawami et al. |
| 2013/0060996 | A1 | 3/2013 | Berke |

OTHER PUBLICATIONS

Notice of Allowance for U.S. Appl. No. 13/558,332, dated Feb. 25, 2014.
Office Action for U.S. Appl. No. 13/620,288, dated Oct. 1, 2013.
Office Action for U.S. Appl. No. 13/791,814, dated May 1, 2014.
Office Action for U.S. Appl. No. 13/619,692, dated May 14, 2014.
Office Action for U.S. Appl. No. 13/620,288, dated May 16, 2014.
Office Action for U.S. Appl. No. 13/791,807, dated May 29, 2014.
Office Action for U.S. Appl. No. 14/178,241, dated Jun. 27, 2014.

* cited by examiner

| Rank ID | Bank ID | Row Address | Column Address | Spare ID |
|---|---|---|---|---|
| 0 | 3 | 0x0A81 | 0x00C1 | 0 |
| 0 | 3 | 0x1BC1 | 0x01E0 | 1 |
| 1 | 0 | 0x0C03 | 0x032D | 1 |
| 1 | 1 | 0x0047 | 0x0004 | 0 |
| 1 | 1 | 0x0161 | 0x00CC | 0 |
| 1 | 2 | 0x1958 | 0x006E | 0 |
| 1 | 2 | 0x04DA | 0x01E9 | 1 |
| 1 | 3 | 0x098C | 0x000E | 1 |

FIGURE 2

| Parameter | Value | Area |
|---|---|---|
| # of bits per WC location w/o compression | 37 bit | |
| Compression factor | 72% | |
| # of bits per WC location w/ compression | 27 bit | |
| ECC/redundant bits | 8 bit | |
| Total number of WC per DRAM | 1000 | |
| Total number of DRAMs on the DIMM | 72 | |
| Subtotal anti-fuse size W/O compression | 3.09 Mb | |
| Subtotal anti-fuse size W/ compression | 2.40 Mb | |
| Max # of DRAMs to be reworked | 2 | |
| Subtotal anti-fuse size | 0.07 Mb | |
| Max # of in-field WC addition per DRAM | 24 | |
| Subtotal anti-fuse size | 0.07 Mb | |
| total NVM size W/O compression | 3.23 Mb | 2.27 mm$^2$ |
| total NVM size W/ compression | 2.54 Mb | 1.79 mm$^2$ |

FIGURE 13

| Parameter | Value | Area |
|---|---|---|
| Smbus clock | 10 MHz | |
| Anti-fuse program time (single cell) | 50 us | |
| Anti-fuse read time | 50 ns | |
| Anti-fuse IO width | 40 bit | |
| Total Anti-fuse size W/O Compression | 3.23 Mb | 2.27 mm$^2$ |
| Total Anti-fuse size W/ Compression | 2.54 Mb | 1.79 mm$^2$ |
| CP for 1-bit PGM | | 0.1 mm$^2$ |
| program time (single macro) | | |
| option 1 | 3.33 s | |
| option 2 | 0.34 s   +   4.23 s | |
| program time (two macros) | | |
| option 1 | 1.67 s | |
| option 2 | 0.34 s   +   2.12 s | |
| AMT load time | | |
| single macro | 3.34 ms | |
| two macros | 1.67 ms | |

FIGURE 14

METHOD OF USING NON-VOLATILE MEMORIES FOR ON-DIMM MEMORY ADDRESS LIST STORAGE

CROSS-REFERENCES TO RELATED APPLICATIONS

The present application is a continuation of and claims priority to U.S. patent application Ser. No. 13/791,814 filed Mar. 8, 2013, which claims priority of and incorporates by reference, for all purposes, U.S. Provisional Patent Application No. 61/664,304 filed Jun. 26, 2012, commonly assigned.

BACKGROUND OF THE DISCLOSURE

The present invention relates generally to solid state memory techniques. More particularly, the present invention provides methods and devices for storing memory cell address list with identified "bad memory cell" in a non-volatile memory device for repairing the bad cell in a dynamic random access memory ("DRAM") device or others.

DRAM continues to be widely used in laptop and workstation computers as well as some of the RAM of video game consoles simply due to its structural simplicity and high density. As DRAM technologies scale to higher and higher density with smaller and smaller feature sizes, the reliability of DRAM cells degrade and certain address locations will not be able to retain information reliably.

BRIEF SUMMARY OF THE INVENTION

The present invention is related to memory devices for electronic applications. More specifically, embodiments of the present invention provide an integrated circuit device and methods of using non-volatile memory for on-DIMM memory-address list storage, which can be implemented on various computing devices, servers, and the like. Merely by way of example, the integrated circuit device can be configured to use anti-fuse memory to store memory-address list and implemented on advanced DRAM memory devices such as SDRAM, DDR SDRAM, RDRAM, SRAM, and Flash devices, and the like. But it will be recognized that the invention as a much broader range of applicability.

In an embodiment, the present invention provides a memory interface device. This device can include address input(s), address output(s), an address match table, a control module, and a multiplexer. In a specific embodiment, the memory interface device can be selected from a register device, a buffer device, an advanced memory buffer, a buffer on-board, or the like and combinations thereof.

The address input(s) can be configured to receive address information from an address stream of a host controller, while the address output(s) can be coupled to a plurality of memory devices and be configured to drive address information. In a specific embodiment, the plurality of memory devices can include a plurality of DRAM devices, Flash devices, or other like memory devices. Furthermore, the multiplexer, which can be a MUX or DEMUX, can be coupled to the address input and the address output.

The address match table can include an array of SRAM cells, or the like. In a specific embodiment, this address match table can include a plurality of bad address information and a plurality of spare memory locations. Each of the plurality of bad address information can be associated with one of the plurality of spare memory locations. Each of the plurality of bad address information can include a rank ID, a bank ID, a chip ID, a row address, and a column address. Additional parameters can also be included, such as offset ID. Each of the plurality of spare memory locations can include a first column, second column, and an nth column. Various numbers and configurations of spare memory locations can be used depending on design and related applications. The address match table can be configured to receive bad address information and can be configured to transfer the spare memory location to replace the bad address associated with the bad address information.

The control module can be a command and address module, or the like. This control module can be integrated with the address match table. In a specific embodiment, this control module can be configured to determine address information from an address stream from an address command bus coupled to a host controller during a run time operation. This control module can be configured to compare each address from the address steam and configured to determine whether each address matches with a stored address in the address match table to identify a bad address. The control module can also be configured to replace the bad address with the revised address of the spare memory location.

In a specific embodiment, the control module can include an input receiver module or a control and status register module. The control module can also include an input command, an input address, and an input chip-select decoder module. Other components, such as a parity checking module, a signal inversion module, a signal delay module, a PLL (Phase-locked loop), a command and address control module, an input buffer termination module, a clock stop power down module, a reset module, and the like, can also be included with the memory interface device.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can be consisted of one or more spare rows, one or more spare columns, or one or more spare banks.

In an embodiment, the present invention can provide a memory integrated circuit device. This device can include a plurality of regular address inputs, at least one spare address configured for a selected mode or an unselected mode, a plurality of control inputs, a plurality of data inputs, a plurality of data outputs, a plurality of memory arrays, and a spare group of memory cells.

In a specific embodiment, each of the plurality of memory arrays can include a plurality of memory cells. Each of these memory cells can be coupled to a data input/output. Also, the spare group of memory cells can include a plurality of spare memory cells. The spare group of memory cells can include one or more spare rows, one or more spare columns, one or more spare banks, or the like. Each of these memory cells can be externally addressable using an address match table and can be configured with the spare address input. The spare address input can be coupled to the address match table to access the spare memory cells. In a specific embodiment, the spare address input can include one of three unused column address inputs A11, A13, and A17.

In a specific embodiment, the plurality of spare memory cells can be accessed from the group of memory cells using the spare address input during the selected mode. During a read operation, data from the accessed spare memory cell can be transferred to one of the plurality of data outputs. During a write operation, data from one of the plurality of data inputs can be transferred into the accessed spare memory cell. During the unselected mode, the spare address input can remain inactive while the plurality of regular address inputs remains active.

Also, the spare group of memory cells can include various configurations of spare columns and spare address inputs. For example, the spare group can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device can also include an encoded command and address bus having a shared command signal and an address signal, an internal data input reference voltage circuit, a command and address parity checking circuit, a set of circuits designed to support connectivity testing, a reset input signal, a set of multi-purpose status registers configured to be read out, or the like and combinations thereof.

In an alternative embodiment, the present invention can provide an integrated circuit device. The device includes an address input(s) configured to receive address information from an address stream via an address command bus coupled to a host controller and an address output(s) configured to drive address information. The device is coupled to a plurality of memory devices provided on a DIMM. The device has an address match table comprising a non-volatile memory device configured to store at least a revised address corresponding to a spare memory location and a bad address of at least one of the plurality of memory devices. The device has a control module configured to process and determine whether each address matches with a stored address in the address match table to identify the bad address and configured to replace the bad address with the revised address of the spare memory location.

In yet another alternative embodiment, the present invention provides an integrated circuit device. The integrated circuit device includes an address input(s) configured to receive address information from an address stream of a host controller and an address output(s) configured to drive address information. The device is coupled to a plurality of memory devices provided on a DIMM. Additionally, the device includes an address match table comprising a non-volatile memory device. The non-volatile memory device is configured to store at least a revised address and a bad address of at least one of the plurality of memory devices. The revised address corresponds to a spare memory location. The integrated circuit device further includes a control module configured to determine address information from the address stream from an address command bus coupled to the host controller during a run time operation. The control module is also configured to process each of the addresses from the address stream and determine whether each processed address matches with a stored address in the address match table to identify the bad address from the address stream and configured to replace the bad address from the address stream with the revised address of the spare memory location. Furthermore, the integrated circuit device includes a multiplexer coupled to the address input and coupled to the address output.

Many benefits are achieved by way of the present invention over conventional embodiments and techniques. For example, embodiments of a memory integrated circuit device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications. Additional benefit lies in an implementation of array of spare memory cells dedicated for a plurality of DRAM memory devices to eliminate inefficient spare rows and/or columns of cells. An integrated circuit device includes a match table using non-volatile memory to store the address-list information from the plurality of DRAM memory devices and use a controller built in a SRAM device to process and determine the address of bad cell and output information of replacing the bad address by a revised address in the dedicated spare memory cells. Specifically, a dual-purpose pin is used to applied high voltage required for non-volatile programming without need for a charge pump to save device real estate. At least this is able to handle a minimized single-bit or very small number of bits at a time to store the address-list information to the non-volatile memory. Also, in-field non-volatile memory update is possible with this integrated circuit device.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2 illustrates a simplified Address Match Table according to an embodiment of the present invention.

FIG. 13 illustrates estimated capacity and area of the anti-fuse non-volatile memory according to embodiments of the present invention.

FIG. 14 illustrates estimated program and read time for non-volatile memory according to an embodiment of the present invention.

DETAILED DESCRIPTION OF SPECIFIC EMBODIMENTS OF THE DISCLOSURE

Certain DRAM memory cells are turned to bad cells or weak cells because of its charge level from programming is not stable. Therefore, bad cell repair operation becomes desirable. In a conventional way, DRAM memory chip includes one or more spare rows and/or columns of cells for being used to replace a cell that is determined to be defective. However, this approach may require that an entire spare row or column be used to repair a single bit, which is done in very poor efficiency.

Therefore, new techniques for replacing the defective cell in DRAM chip with much improved efficiency are desired. For example, a random repair method may be implemented to use logic for randomly addressing any of spare memory cells without need the use of an entire row or column of spare cells to replace a single defective cell. Advanced DRAM devices such as SDRAM or DIMM devices can be provided within an integrated memory chip without requiring allocation of those spare rows or columns, recovering 3-5% silicon area on the chip by eliminating them. Additionally more reliable storage methods may be implemented for storing the address list information especially the "weak cells" so that the information can be used to manage or repair weak cells in the advanced DIMM memory devices. One approach is to use non-volatile memory device for its long term persistency to store the location of "weak cells". Additionally, other information such as chip configurations, firmware codes, test and data patterns for built in test (BIST), look-up tables, and more can also be stored by the same non-volatile memory device.

Figure 7:
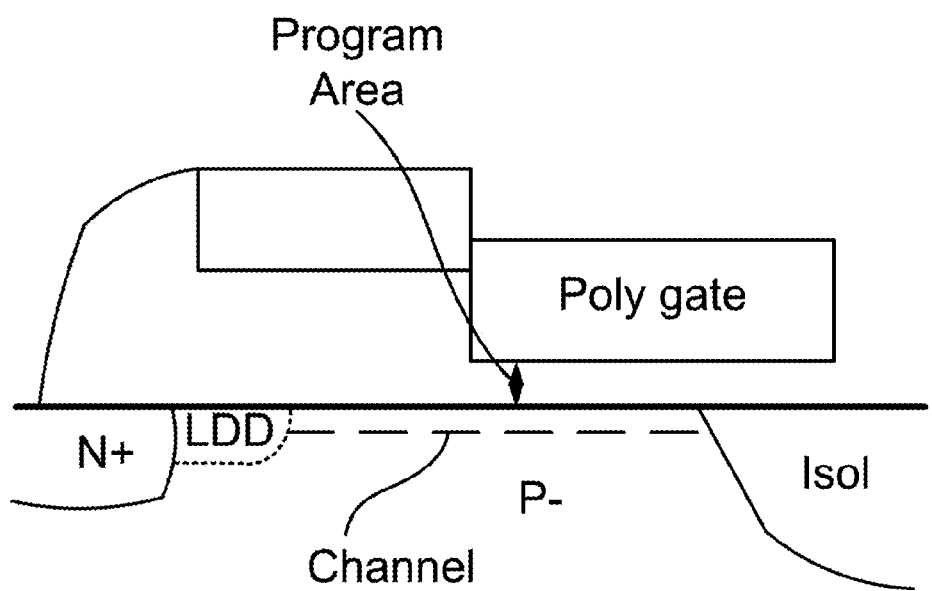
FIG. 7 illustrates an exemplary diagram of an anti-fuse non-volatile memory cell according to prior art.
Figure 8:
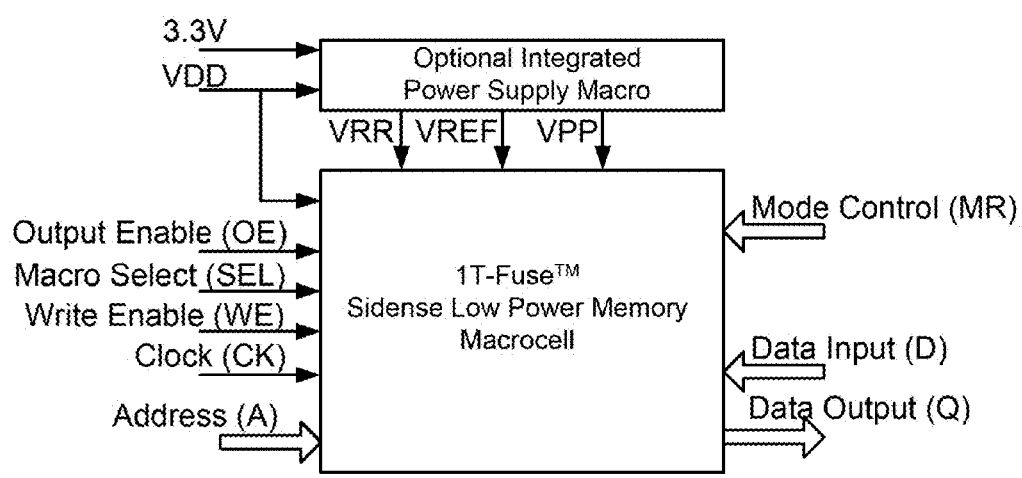
FIG. 8 illustrates an exemplary anti-fuse macro-cell using a charge-pump circuit for generating high voltages from low voltage according to prior art.

There are many different non-volatile memory options that can be used for this purpose such as NOR-flash memory, NAND-flash memory, Phase-change memory, E-fuse memory, Anti-fuse memory, Memristor RAM, Ferroelectric RAM (F-RAM), Magnetoresistive RAM (MRAM), CBRAM PROM, EPROM, EEPROM, and others. Certain types of non-volatile memories require high-voltages (i.e., high DC voltages) to program the memory cells. For example, as shown in FIG. 7, an exemplary single-transistor diagram based on an anti-fuse split-channel non-volatile memory cell is illustrated. The anti-fuse non-volatile cells may require voltages in excess of 4 volts to program. In order to provide the required high-voltage for programming the non-volatile memory device, charge pump circuits are widely used to generate high DC voltages from available low DC voltages. FIG. 8 illustrates an exemplary Sidense 1T-fuse™ macrocell using a charge-pump circuit for generating high voltages from a low voltage source. As shown, an integrated power supply circuitry including charge-pump circuits is provided to generate the required high voltages. The physical dimension of the charge-pump circuit will be proportional to the current drive capability of the circuit. For example the size of the integrated power supply macro can be 4-8 times larger to enable programming 8 memory cells at once compared to just programming a single cell at a time.

Additionally, using integrated power supply to generate the required high voltages to program memory cells will introduce a tradeoff between programming time of the whole memory and physical dimensions of the integrated power supply circuitry. Speed of programming the whole non-volatile memory will depend on total size of the memory and also on how many cells can be programmed in parallel based on the program time for each single cell. Larger integrated power supply circuitry (with higher current drive capability) means more silicon real estate (i.e., area) which also means more expensive products. Smaller integrated power supply circuitry (with lower current drive capability) means longer program time for the whole non-volatile memory which again means more expensive product due to longer time to program the non-volatile memory at production.

A trend in the development of memory storage devices is that as the storage cells continue to shrink due to advancements in process technology, storage cells in low latency memories such as DRAM devices may become more susceptible to errors that occur due to aging effects or repeated accesses. Moreover, the number of weak bits due to natural process variations will continue to increase. Accordingly, it is desirable that spare storage cells can be utilized to correct for the presence of faulty storage cells in low latency memory that may develop over the lifetime of the device.

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

A system and method are provided for replacing faulty or weak memory storage cells in a memory system through the use of an enhanced memory interface circuit or enhanced memory controller device and the use of redundant memory storage cells.

The present invention provides for a method that may be implemented in different ways for different systems. An implementation is described herein as an illustrative example. The example should not be construed as limiting the scope of the claims according to the present invention.

In an example, the present techniques provide for support of weak cell management in DRAM devices. It is believed that as DRAM process technology continue to advance, DRAM cell storage capacitance will continue to decrease and more and more DRAM storage cells will be unable to meet specified data retention time requirements. Furthermore, as the number of weak DRAM storage cell increases, DRAM devices as a whole will be unable to provide sufficient number of redundant rows and redundant columns to continue to effect repairs and present the façade of perfect storage devices. According to the present example, the techniques provide logic devices coupled with DRAM memory cells to help healing ailing DRAM devices and mitigate the ill effects of the weak DRAM cells. Further details of the present system and method can be found throughout the present specification and more particularly below.

Example: Utilizing an Address Match Table in Memory Interface Circuit, Controlling Spare Memory Storage Cells to Dynamically Replace Faulty Storage Cells in Memory Devices, as illustrated by FIG. 1.

Figure 1:
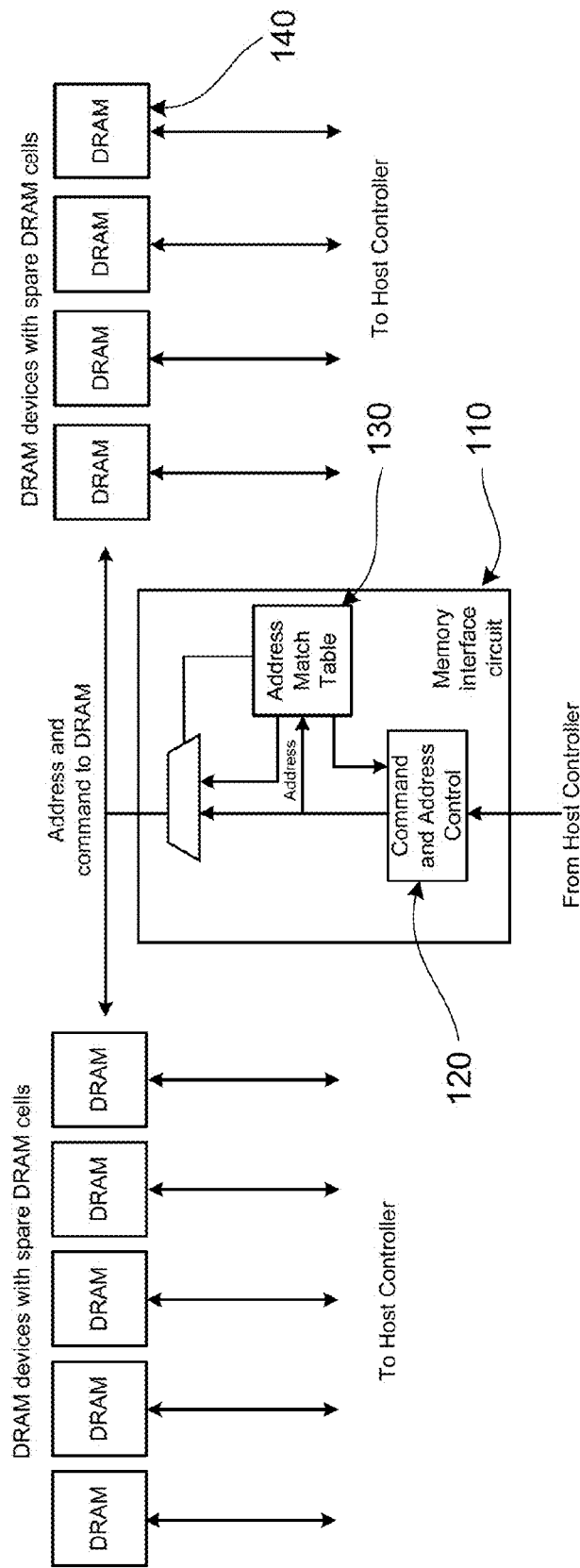
FIG. 1 illustrates a simplified block diagram of an interface circuit according to an embodiment of the present invention.

FIG. 1 shows an example of use of an enhanced interface circuit that, in combination with spare cells in DRAM devices, can function to replace faulty memory locations in the DRAM devices. In FIG. 1, an enhanced memory interface circuit, labeled as 110 is shown to contain a command and address control unit, labeled as 120, and an Address Match Table, labeled as 130. The enhanced memory interface circuit re-drives addresses and commands from the host controller to the DRAM devices, one of which is labeled as 140 in FIG. 1. The DRAM devices contain spare DRAM cells, the addresses of which the enhanced memory interface circuit can select and effect the replacement of faulty or weak storage cell locations, as illustrated by the Table in FIG. 2.

As an example, the DRAM device may include a plurality of memory cell arrays, a plurality of switch blocks, and a plurality of sensing amplifying units. Each of the memory cell arrays includes at least one memory cell, and each memory cell may be connected to a word line and a bit line. Of course, other features exist with the DRAM device.

FIG. 2 shows an example of the Address Match Table, labeled as 130 in FIG. 1. FIG. 2 shows that the Address Match Table contains addresses of faulty memory storage cells. In the case of FIG. 2, the addresses are listed in terms of DRAM address formats: Rank ID, Bank ID, Row Address and Column Address. The reference spare ID can be "0" or "1," although there can be variations. The spare ID may be used to indicate data bus offset as to select subset(s) of DRAM devices to respond to the selection of a spare location. For example, the offset ID may indicate, for example, that: only the left side of the memory module should be matched against the bad memory address, only the right side of the memory module should be matched against the bad memory address, the entire width (one rank) of the memory module should be matched against the bad memory address, or a single DRAM device should be matched against the bad memory address.

In other implementations, address fields for Chip ID (CID) and Bank Group ID may also be used. The addresses of faulty or weak memory storage cells contained in the Address Match Table may be determined by testing during manufacturing or special run-time testing. The entries in the Address Match Table may also be dynamically updated during runtime if it is determined that additional memory storage locations are weak or faulty. The function of the Address Match Table is to act as a filter of addresses and commands that flow through the enhanced memory interface circuit 110. In the case that a given memory access is matched to an entry in the Address Match Table, the Address Match Table replaces the address of the memory access with the address of a spare memory location. In this manner, the existence of the faulty or weak memory address is hidden from the host memory controller, and the enhanced memory interface circuit enables the memory devices to present a contiguous memory address space without faulty or weak cell locations, as shown in FIG. 3.

Figure 3:
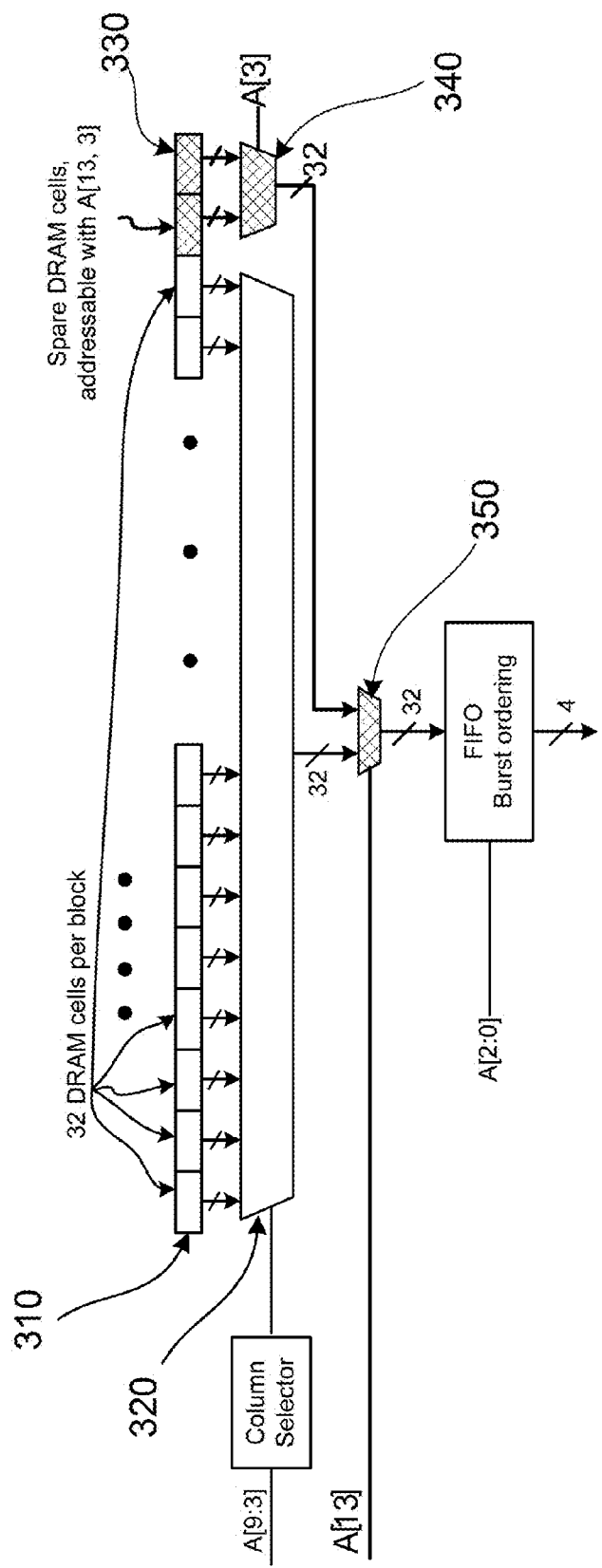
FIG. 3 illustrates a simplified diagram of spare memory cells in a DRAM device according to an embodiment of the present invention.

FIG. 3 shows an exemplary implementation of spare memory cells in a DRAM device. The spare memory storage cells are arranged in terms of added columns for each row. FIG. 3 shows a row of DRAM storage cell organized as blocks, with 32 DRAM cells per block. A block of 32 DRAM storage cells is labeled as 310 in FIG. 3. FIG. 3 also shows that in the exemplary DRAM device, column addresses A [9:3] are used to select between different blocks of DRAM storage cells through a block of circuits collectively labeled as a large multiplexor. The large multiplexor is labeled as 320 in FIG. 3. FIG. 3 also shows the implementation of two blocks of spare DRAM cells, labeled as 330. FIG. 3 further illustrates that the two blocks of spare DRAM cells can be separately selected through the use of the column address A[3] through a multiplexor circuit labeled as 340. Finally, the column address A[13] can be used to select between data from the baseline memory array or data from the spare memory cells through the multiplexor labeled as 350 in FIG. 3.

To prove the principle and operation of the present techniques, examples have been prepared. These examples are merely for illustration purposes and should not unduly limit the scope of the claims herein. One of ordinary skill in the art would recognize many variations, alternatives, and modifications.

To assist the reader, the following terms are defined as examples.
AMT: Address Match Table
CID: Chip ID
IFR: In-Field Repair
LRDIMM: Load-Reduced Dual Inline Memory Module
MB: Memory Buffer
MemBIST: Software tool to generate built in self test blocks for a memory matrix as a
VHDL model for the whole memory system.
RCD: Registering Clock Driver, Also known more simply as the "Register"
RDIMM: Registered Dual Inline Memory Module
RID: Rank ID
SPD: Serial Presence Detect
VRT: Variable Retention Time
WBA: Weak Bit Address
WBAL: Weak Bit Address List
WCM: Weak Cell Management In an example, techniques include a method that is provided within a framework wherein DRAM devices are characterized, weak cells within the DRAM devices are detected, their address locations stored in non-volatile memory locations, and the subsequent usage of the Weak Bit Address list to effect dynamic repairs that are transparent to the host memory controller. The section on MemBIST will provide descriptions of testing algorithms to detect weak cells, and the section on Weak Bit Address List storage format will specify their storage format in non-volatile memory, and the sections that describe specific repair concepts will detail the usage of the Weak Bit Address List to effect weak cell management.

In an example, the present description provides a high level architectural specification that is independent of specific DRAM types, specific DIMM types, and specific weak bit replacement concepts. It is intended that this specification will act as the master specification from which an implementation-specific architectural specification may be quickly derived.

In an example, the Externally-Addressable-Spare-Columns-in-DRAM concept is designed for implementation on a DDR3 or DDR4 Register DIMM (RDIMM) or LRDIMM. The Externally-Addressable-Spare-Columns-in-DRAM concept also utilizes a known Weak Bit Address List (WBAL) stored in one or more Address Match Tables (AMT) to compare against addresses of DRAM commands that flow through the Address and Command Path of the RDIMM or LRDIMM. In the case that a match to a known Weak Bit Address, the Address Match Table replaces the column-address of the Column-Access command with a column-address to a set of spare columns in the DRAM devices. The spare-columns are used to provide reliable storage locations for data in place of columns with known faulty or weak DRAM storage cells.

Figure 4:
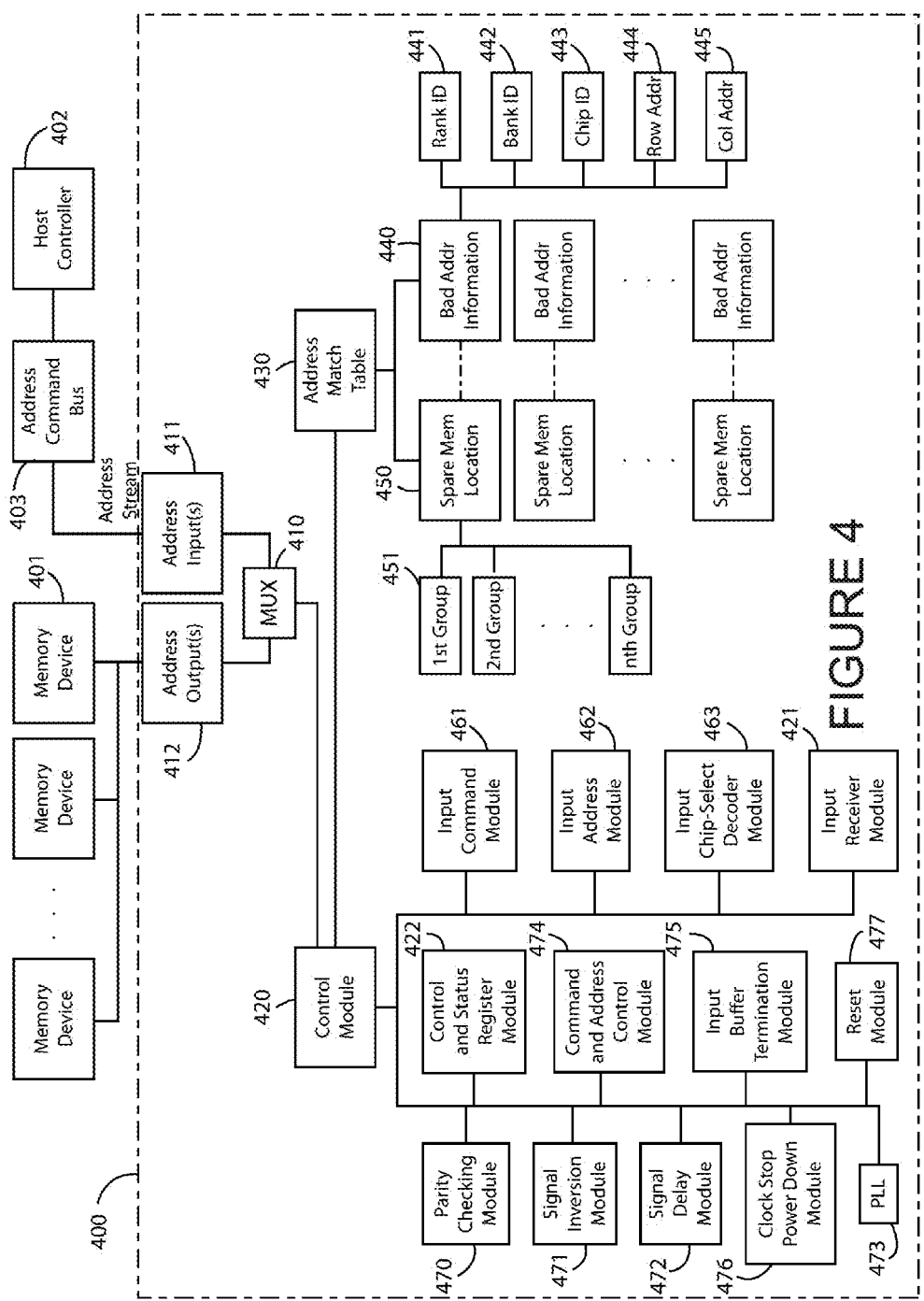
FIG. 4 illustrates a simplified block diagram of a memory interface device according to an embodiment of the present invention.

In an example, FIG. 4 illustrates a DDR4 Registered DIMM where the DDR4 Register has been modified to incorporate one or more Address Match Tables. The Address Match Tables check addresses of DRAM commands as the DRAM commands flow through the DDR4 Register against known Weak Bit Address locations. In the case of an address match, the DDR4 Register dynamically replaces the column-address of the column-access command with the address of a spare column in DRAM devices.

To facilitate the implementation of the Spare-Columns-in-DRAM concept the architectural description of the Address Match Table and Externally-Addressable-Spare-Columns-in-DRAM may be found in the following sections (1) Address Match Table; (2) Externally-Addressable-Spare-Columns-in-DRAM.

In an embodiment, the present invention provides a memory interface device. As shown in FIG. 4, the device 400 can include address input(s) 411, address output(s) 412, an address match table 420, a control module 430, and a multiplexer 410. In a specific embodiment, the memory interface device 400 can be selected from a register device, a buffer device, an advanced memory buffer, a buffer on-board, or the like and combinations thereof.

The address input(s) 411 can be configured to receive address information from an address stream of a host controller, while the address output(s) 412 can be coupled to a plurality of memory devices and be configured to drive address information. In a specific embodiment, the plurality of memory devices 401 can include a plurality of DRAM devices, Flash devices, or other like memory devices. Furthermore, the multiplexer 410 can be coupled to the address input and the address output.

The address match table 430 can include an array of SRAM cells, or the like. In a specific embodiment, this address match table 430 can include a plurality of bad address information 440 and a plurality of spare memory locations 450. Each of the plurality of bad address information 440 can be associated with one of the plurality of spare memory locations 450. Each of the plurality of bad address information can include a rank ID 441, a bank ID 442, a chip ID 443, a row address 444, and a column address 445. Additional parameters can also be included. Each of the plurality of spare memory locations can include a plurality of memory groups 451, which can include a first column, second column, and an nth column. Row and bank configurations can also be used, as various numbers and configurations of spare memory locations can be used depending on design and related applications. The address match table can be configured to receive bad address information and can be configured to transfer the spare memory location to replace the bad address associated with the bad address information.

The control module 420 can be a command and address module, or the like. This control module 420 can be integrated with the address match table. In a specific embodiment, this control module 420 can be configured to determine address information from an address stream from an address command bus 403 coupled to a host controller 402 during a run time operation. This control module 420 can be configured to compare each address from the address steam and configured to determine whether each address matches with a stored address in the address match table 430 to identify a bad address. The control module 420 can also be configured to replace the bad address with the revised address of the spare memory location 450.

In a specific embodiment, the control module 420 can include an input receiver module 421 or a control and status register module 422. The control module can also include an input command 461, an input address 462, and an input chip-select decoder module 463. Other components, such as a parity checking module 470, a signal inversion module 471, a signal delay module 472, a PLL (Phase-locked loop) 473, a command and address control module 474, an input buffer termination module 475, a clock stop power down module 476, a reset module 477, and the like, can also be included with the memory interface device 400.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

Figure 5:
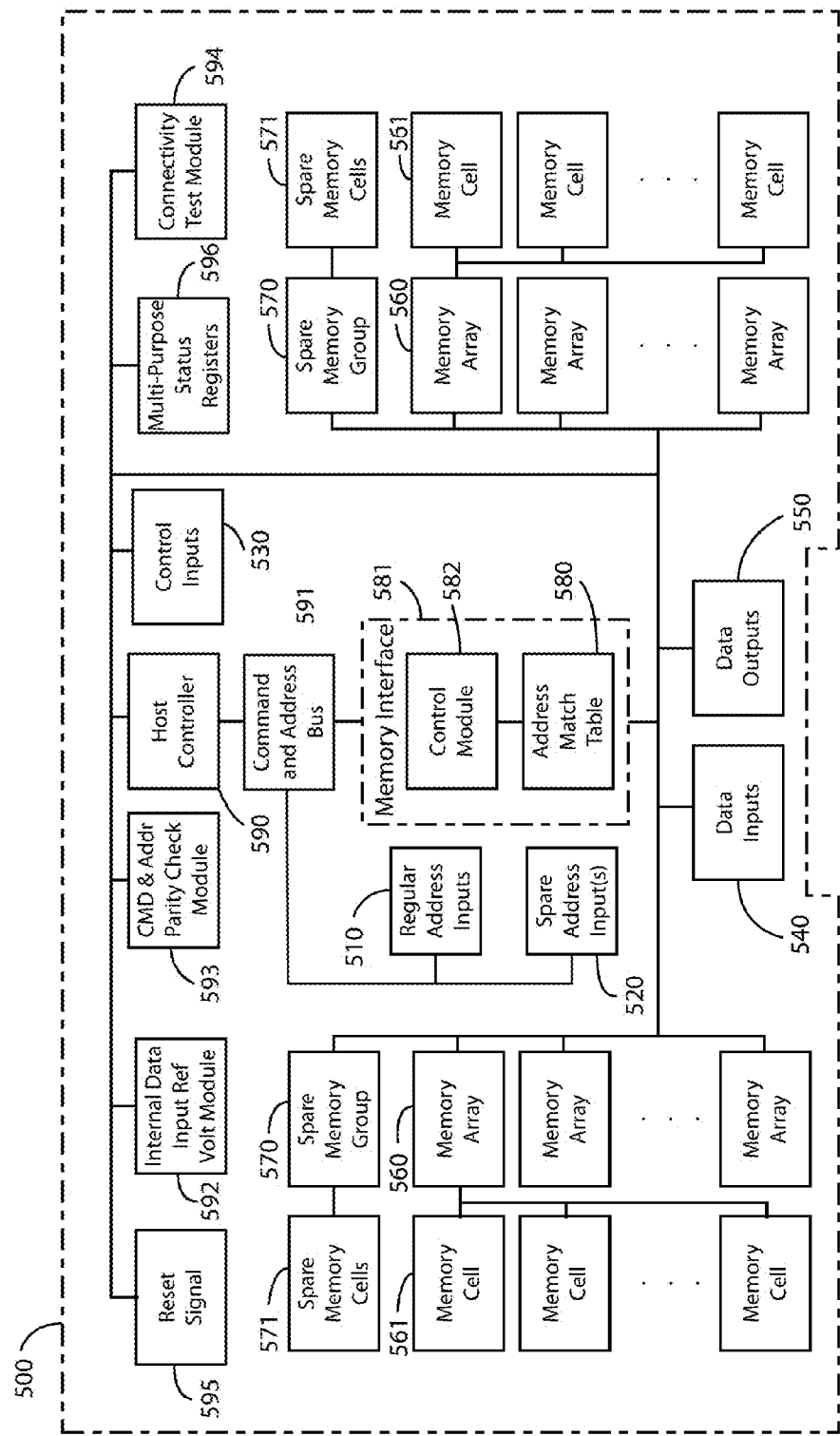
FIG. 5 illustrates a simplified block diagram of a memory integrated circuit device according to an embodiment of the present invention.

FIG. 5 illustrates a simplified block diagram of a memory integrated circuit device according to an embodiment of the present invention. As shown, this device 500 can include a plurality of regular address inputs 510, at least one spare address 520 configured for a selected mode or an unselected mode, a plurality of control inputs 530, a plurality of data inputs 540, a plurality of data outputs 550, a plurality of memory arrays 560, and a spare group of memory cells 570.

In a specific embodiment, each of the plurality of memory arrays 560 can include a plurality of memory cells 561. Each of these memory cells can be coupled to a data input/output 540/550. Also, the spare group of memory cells 570 can include a plurality of spare memory cells 571. The spare group of memory cells 571 can include a spare column, a spare row, a spare bank, or the like. Each of these memory cells 571 can be externally addressable using an address match table 580 and can be configured with the spare address input 520. The spare address input 520 can be coupled to the address match table 580 to access the spare memory cells 571. The address match table 580 can be provided within a memory interface device 581 with a control module 582. This memory interface 581 can be similar to that described for FIG. 4 above. In a specific embodiment, the spare address input 520 can include one of three unused column address inputs A11, A13, and A17.

In a specific embodiment, the plurality of spare memory cells 571 can be accessed from the group of memory cells 570 using the spare address input 520 during the selected mode. During a read operation, data from the accessed spare memory cell 571 can be transferred to one of the plurality of data outputs 550. During a write operation, data from one of the plurality of data inputs 540 can be transferred into the accessed spare memory cell 571. During the unselected mode, the spare address input 520 can remain inactive while the plurality of regular address inputs 510 remains active.

Also, the spare group of memory cells 570 can include various configurations of spare columns and spare address inputs. For example, the spare group 570 can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device 500 can also include an encoded command and address bus 591 having a shared command signal and an address signal, an internal data input reference voltage circuit 592, a command and address parity checking circuit 593 a set of circuits designed to support connectivity testing 594, a reset input signal 595, a set of multi-purpose status registers 596 configured to be read out, or the like and combinations thereof. These modules and circuits can be coupled to a host controller 590. Those of ordinary skill in the art will recognize other variations, modifications, and alternatives.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

In an example, the present invention provides a method for operating a memory interface device, as outlined below.
1. Receive, at an address input(s) of a memory interface device, address information from an address stream of a host computer;
2. Process the address stream from an address command bus coupled to the host controller during a run time operation;
3. Compare successively each address from the address stream from information in an address match table to determine to whether an address matches with a stored address in an address match table;
4. Identify a bad address provided in the address match table; and
5. Replace the bad address with a revised address of a spare memory location;
6. Transfer the revised address to a multiplexer coupled to the address output;
7. Drive address information from an address output(s) of the memory interface device to a plurality of memory devices; and
8. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 6:
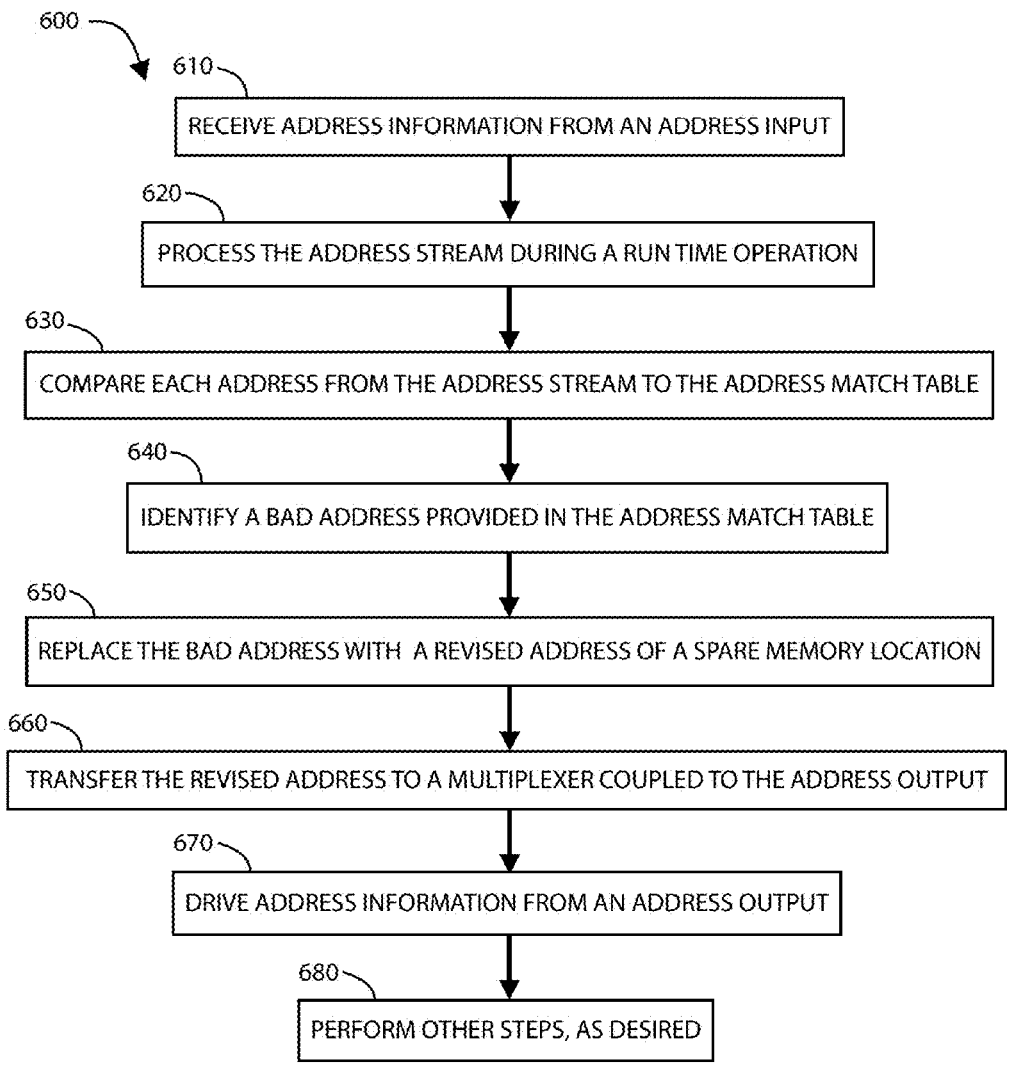
FIG. 6 illustrates a simplified flow diagram for operating the Address Match Table according to an embodiment of the present invention.

FIG. 6 illustrates a simplified flow diagram for operating an address match process for replacing a bad cell with a spare cell according to an embodiment of the present invention. As shown, method 600 can begin with receiving, at address input or inputs of a memory interface device, address information from an address stream of a host computer, step 610. This memory interface device can be coupled to a host computer.

The memory interface device can be selected from a register device, a buffer device, an advanced memory buffer, or a buffer on-board. These memory devices can include a plurality of DRAM devices, Flash devices, or other like devices and combinations thereof.

During a run time operation, the address stream from an address command bus coupled to the host controller can be processed, step 620. Each address from the address stream can be compared successively to determine whether an address matches with a stored address in an address match table, step 630. The address table can include a plurality of SRAM cells and can include a plurality of bad address information and a plurality of spare memory locations. Each of these bad address locations can be associated with one of the spare memory locations. Each of the bad address information can include a rank ID, a bank ID, a chip ID, a row address, and a column address. Each of the spare memory locations can include one or more memory groups, which can include columns, rows, or banks, and the like. In a specific embodiment, each of the spare memory locations can include a first, second, and an nth column.

A bad address in the address match table can be identified, step 640, and can be replaced with a revised address of a spare memory location, step 650. The revised address can be transferred to a multiplexer coupled to the address output, step 660. The address match table can be configured to receive bad address information and transfer the spare memory location to replace the bad address associated with the bad address information. Also, method 600 can include driving address information from an address output or outputs of the memory interface device to a plurality of memory devices, step 670.

In a specific embodiment, the comparing, identifying, and replacing can be under control of a control module. This control module can be integrated with the address match table and can further include an input receiver module, a control and status register module, an input command module, and input address module, and an input chip-select decoder module, and other like modules. Further details regarding components of these devices and process are described previously for FIGS. 1-5. Furthermore, other steps can be performed as desired according to various specifications and applications, step 680.

One object of the present invention is to provide an integrated circuit device using non-volatile memories for on-DIMM memory address list storage. In an embodiment, the device includes an address input(s) configured to receive address information from an address stream via an address command bus coupled to a host controller and an address output(s) configured to drive address information, and is coupled to a plurality of memory devices provided on a DIMM. Additionally, the device has an address match table comprising a non-volatile memory device configured to store at least a revised address corresponding to a spare memory location and a bad address of at least one of the plurality of memory devices. Furthermore, the device has a control module configured to process and determine whether each address matches with a stored address in the address match table to identify the bad address and configured to replace the bad address with the revised address of the spare memory location. For example, the integrated circuit device substantially the device 400 implemented based on FIG. 4. The device may be built in a single chip with the plurality of memory devices provided on a DIMM.

In an embodiment, the non-volatile memory device proposed for address-list (including bad address and revised address) storage is an anti-fuse memory device, although other types of non-volatile memories can be implemented.

FIG. 7 illustrates an exemplary single-transistor diagram of an anti-fuse non-volatile memory cell. This anti-fuse non-volatile cell will be used in this invention, which can be made using TSMC 40 nm CMOS Logic process CLN40G with 0.9V core and 1.8V 10 oxide or other suitable process. It is known that the anti-fuse non-volatile cells may require voltages in excess of 4 volts to program. In order to provide the required high-voltage for programming the non-volatile memory device, a traditional way is to use charge pump circuits to generate high DC voltages from available low DC voltages. FIG. 8 illustrates an exemplary macrocell using a charge-pump circuit for generating high voltages from a low voltage source. As an example, the macrocell can be made using Sidense 1T-Fuse™ manufactured by Sidense Corp. As an example, the 1T-Fuse™ Logic NVM IP is an antifuse-based, embedded one-time programmable (OTP) technology that is secure, reliable, low power and cost-effective. The IP can be manufactured in standard-logic CMOS processes and does not require any additional mask layers or process steps. The technology is based on a one transistor non-volatile memory cell that does not rely on charge storage, rendering a secure cell that cannot be reverse engineered. The 1T-Fuse™ is smaller than any alternative NVM IP manufactured in a standard-logic CMOS process. The OTP can be programmed in the field, during wafer or production testing. In an example, the Sidense products are available from 180 nm to 28 nm and are portable to 20 nm and below. See, for example, www.sidense.com.

As shown, an integrated power supply circuitry including charge-pump circuits is provided to generate the required high voltages. The macrocell can be made up to a few MGbits with retention time greater than 10 years for constant read. It has a synchronous byte-wide peripheral interface capable of performing Read operation to whole word line in one clock cycle. However, extra real estate requirement would be an issue. The physical dimension of the charge-pump circuit will be proportional to the current drive capability of the circuit. For example the size of the integrated power supply macro can be 4-8 times larger to enable programming 8 memory cells at once compared to just programming a single cell at a time.

Alternatively, there is a tradeoff between the programming speed and non-volatile memory chip area. Speed of programming the whole non-volatile memory will depend on total size of the memory, on how many cells can be programmed in parallel, and on program time for a single cell. Using integrated power supply to generate the required high voltages to program memory cells will therefore introduce a tradeoff between programming time of the whole memory and physical dimensions of the integrated power supply circuitry. Larger integrated power supply circuitry (with higher current drive capability) means more silicon area which also means more expensive products. Smaller integrated power supply circuitry (with lower current drive capability) means longer program time for the whole non-volatile memory which again means more expensive product due to longer time to program the non-volatile memory at production.

Further, the integrated power supply may be avoided if the required high voltages could be provided externally. This would result in a lower cost product as the physical dimensions of the product will be smaller by eliminating or substantially reducing the physical size of the integrated power supply (e.g., charge-pump circuit), and also reducing the program time of the non-volatile memory at production, as external high voltage sources with practically any required current drive capability can be used to program multiple cells in parallel without any on-chip real estate penalty. However, current DDR3 or DDR4 JEDEC standards have no provision for connecting to 4-5V supplies at DIMM interface. Adding a high voltage pin would make the part non-JEDEC compliant. Even if one manages to add an additional electrical connection to the DIMM to provide high voltages without violating the JEDEC DIMM interface and use this additional electrical interface to program the non-volatile memory at production time, this will still be a problem. Since the system that uses the DIMM will not provide the non-JEDEC high voltage at the DIMM interface, a novel technique for programming the non-volatile memory in the field needs to be implemented, which is illustrated in embodiments of the present invention disclosed throughout the specification and particularly below.

According a specific embodiment, a hybrid solution for non-volatile memory programming (for storing DRAM cells' address-list including bad memory cells) is proposed. In particular, an integrated circuit device including an effective charge-pump with 1-bit (or some small number of bits) programming capability to provide the required high-voltage via a dual-purpose pin for programming the non-volatile memory. This would enable in-field programming capability and keep the on-chip area overhead minimal. Although this is relatively slow, but it is acceptable as the number of in-field updates is very limited and has not any impact on the product cost functionality and usability. The dual-purpose pin can be chosen from many existing ones that are capable of providing high-voltage as well as being compliant both JEDEC and DIMM test functionality while programming the non-volatile memory. In a specific embodiment, the option is to use VREFCA pin.

Figure 9:
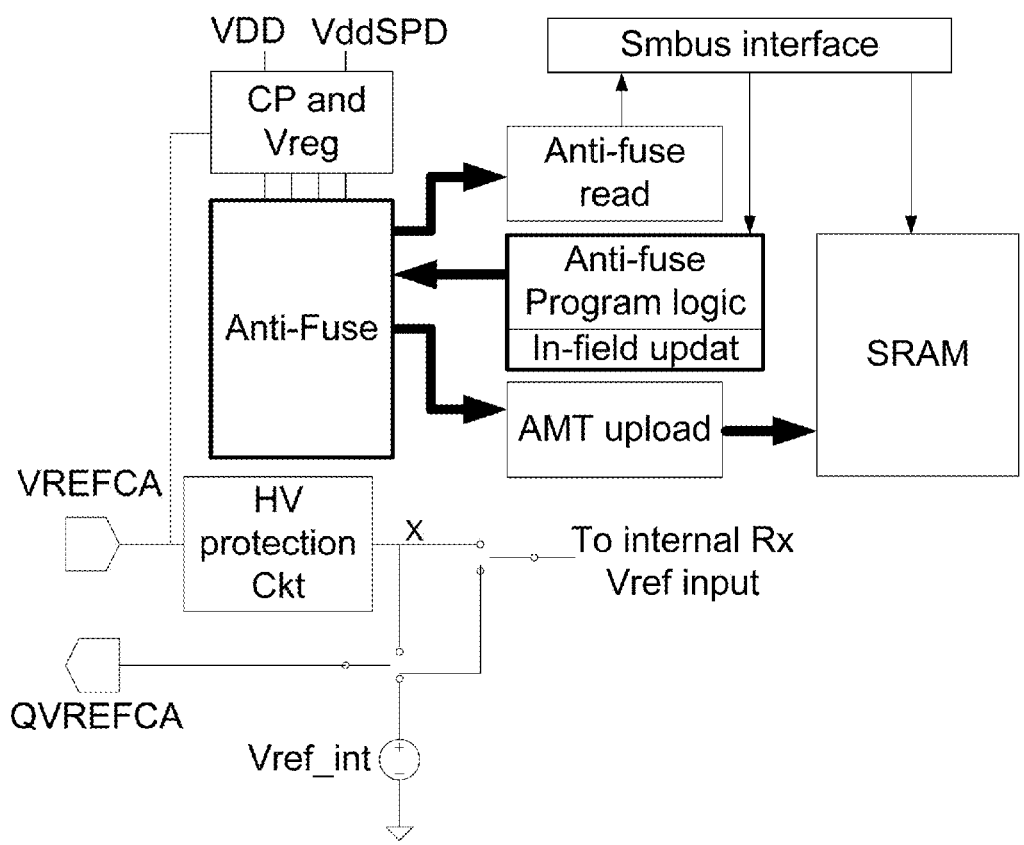
FIG. 9 illustrates a simplified diagram of an integrated circuit used in register chip using VREFCA pin as a high voltage source according an embodiment of the present invention.

FIG. 9 illustrates a simplified diagram of an integrated circuit device used in register chip or DRAM using VREFCA pin as a high voltage source according an embodiment of the present invention. This diagram is merely an example, which should not unduly limit the claims herein. One skilled in the art would recognize other variations, modifications, and alternatives. In this example, VREFCA pin is used for providing high voltage in a register chip used in RDIMM/LRDIMM devices or memory buffer chip in LRDIMM devices. Similarly, the VREFCA pin dual-purposely for providing a high voltage to program non-volatile memory can be used in a DRAM chip if the non-volatile memory is inside the DRAM chip. As shown in FIG. 9, VREFCA pin is coupled to existing CP/Vreg circuit to provide the required high voltage up to 5 V for programming (VPP), while remaining fully compatible with JEDEC pin out. The existing CP/Vreg circuit is sized only to program 1-bit or very small number of bits at a time. It has very little area penalty (~0.1 mm$^2$) and only is designated for in-field operation. No additional charge-pump is needed. In a specific embodiment, this option can program the whole 10 width of an anti-fuse non-volatile memory at once (reduced ATE time). During non-volatile programming, internal circuit (such as RX) and DRAM devices will run from internally generated voltage Vref int. The same VREFCA pin is also coupled to a HV protection circuit. In an embodiment, the HV protection circuit will clamp the voltage at node "X" to a low voltage (e.g., 0.75 times the voltage of the logic transistor and switches) so all internal circuits are protected from high voltage damage. Several non-volatile programming strategies are proposed using high-voltage provided by the VREFCA pin to program address information into an anti-fuse non-volatile memory device for cell rework and in-field data update.

Figure 10A:
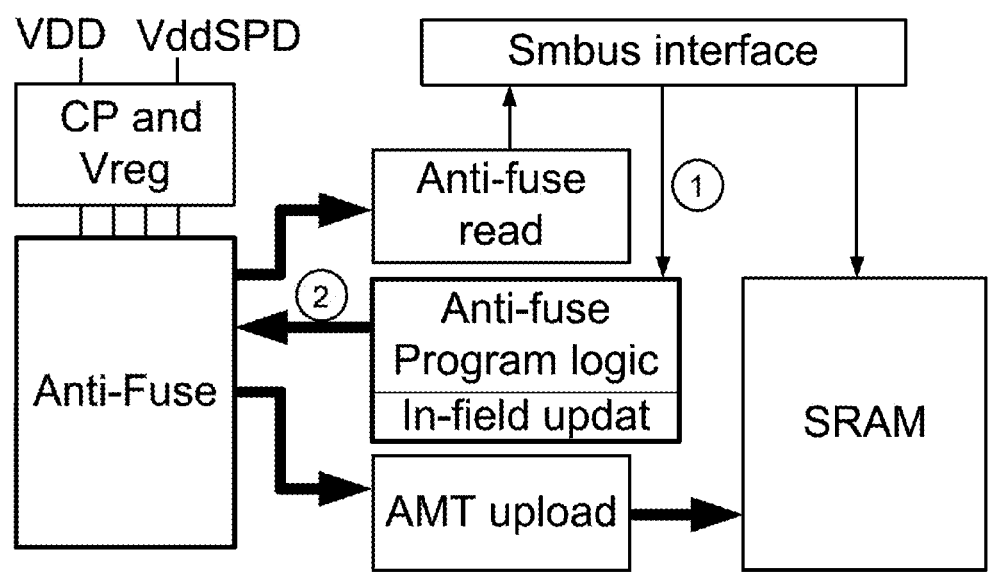
FIG. 10A illustrates a non-volatile programming mode according to an embodiment of the present invention.

In a specific embodiment, through a simplified block diagram of an integrated circuit device partially illustrated in FIG. 10A, a non-volatile memory program strategy is disclosed. In particularly, this approach is executed by directly programming the anti-fuse non-volatile memory through a memory chip interface. In an example, the memory chip interface is a serial interface such as SMbus. In other examples, parallel interface can be used. In an embodiment, the memory chip interface is Memory Interface 581 shown in FIG. 5. It couples to Command and Address Bus 591 which provides regular address inputs information 510 and spare address input(s) information 520. As shown in FIG. 10A, a first step of the non-volatile programming is to receive the address information from the chip interface by Anti-fuse program logic circuit which corresponds to a control module 582. A second step of the non-volatile programming is to write the information via HV from VREFCA pin into the Anti-fuse memory device. Assuming that the memory chip interface does not limit the data throughput, program time is determined by the size of non-volatile memory and how many cells can be accessed simultaneously. Parallelism can reduce the program time, while the limiting factor lies in SMbus interface max clock rate and total capacity. In this mode, if the address information that is being programmed into non-volatile memory is necessary for the functional test of the product, then the program time of the non-volatile memory plus the time it takes to transfer the information to other logics like SRAMs associated with the same integrated circuit device will directly add to the test time at production.

Figure 10B:
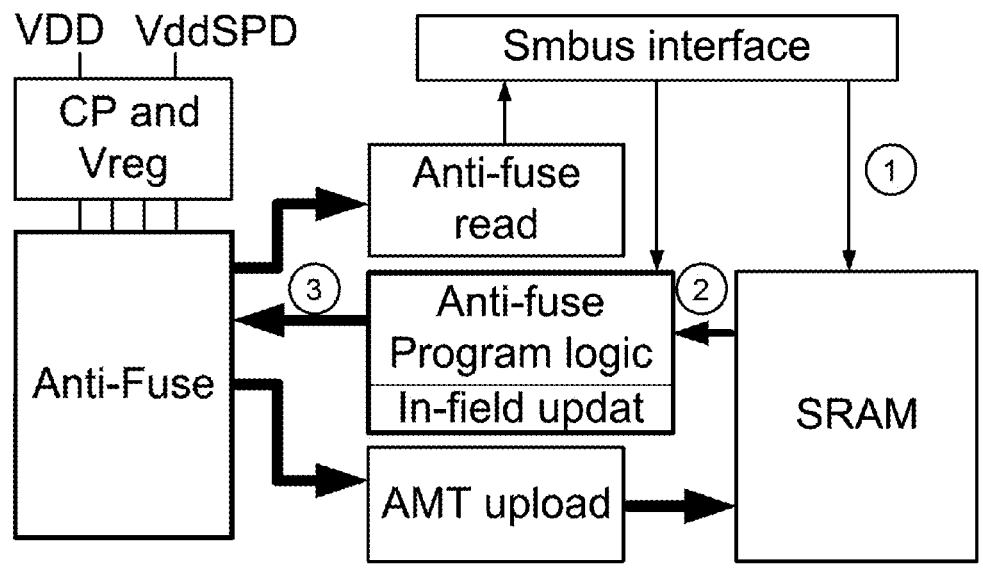
FIG. 10B illustrates a non-volatile programming mode according to another embodiment of the present invention.

In another specific embodiment, through a simplified block diagram of the same integrated circuit device partially illustrated in FIG. 10B, another non-volatile memory program strategy is disclosed. In particularly, this approach is executed by firstly programming a separate logic SRAM device through the chip interface (such as SMbus or any other parallel or serial interfaces). After data is transferred to SRAM, the functionality of the device can be tested. Secondly, the SRAM device sends the programmed address information to the Anti-fuse program logic device. Then the Anti-fuse program logic device programming via HV from VREFCA pin into the non-volatile memory in the background. ATE test impact can be potentially limited to SRAM program time only. The limitation may be that if the test involves adjusting the voltage applied through dual-purposed PIN (e.g., VREFCA pin), then that specific feature cannot be tested during the background programming (step 3) of the non-volatile memory. In an implementation, the data (e.g., the address information) can be compressed by an on-chip compression engine (or logic device) included in the integrated circuit device, although it may add complexity and additional silicon area.

Figure 10C:
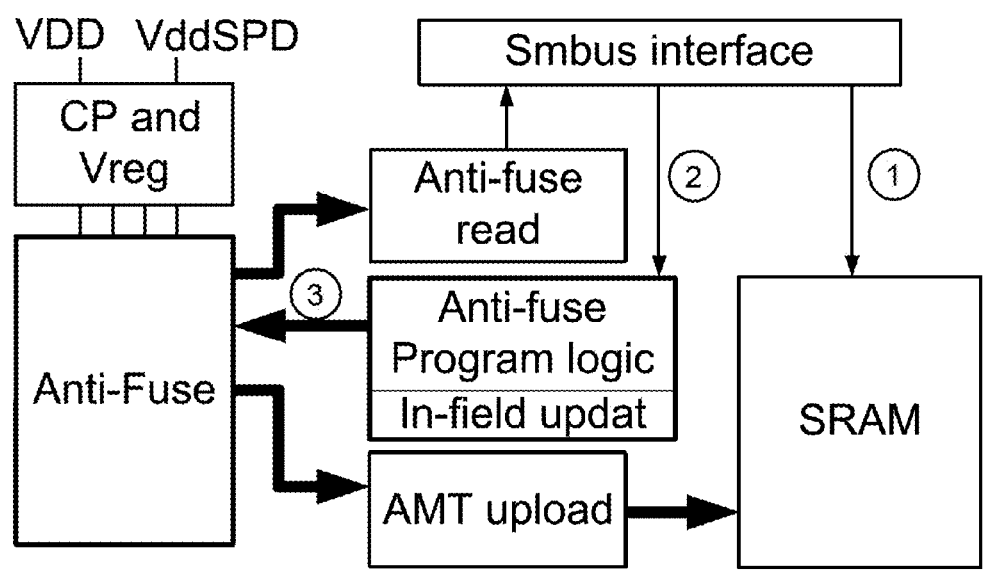
FIG. 10C illustrates a non-volatile programming mode according to an alternative embodiment of the present invention.

In yet another specific embodiment, through a simplified block diagram of the same integrated circuit device partially illustrated in FIG. 10C, another non-volatile memory program strategy is disclosed. In particularly, this approach is executed by firstly programming the SRAM logic device through the chip interface (such as SMbus or any other parallel or serial interfaces). After data is transferred to SRAM, the functionality of the device can be tested. A second step of the non-volatile programming is to receive again the address information from the chip interface by Anti-fuse program logic circuit. A third step is to use HV from VREFCA pin to program the address information from the Anti-fuse program logic device into the non-volatile memory cells in the background. ATE test impact can be potentially limited to SRAM program time only. The limitation may be that if the test involves adjusting the voltage applied through dual-purposed PIN (e.g., VREFCA pin), then that specific feature can not be tested during the background programming (step 3) of the non-volatile memory. In an implementation of this approach, no on-chip compression logic device is needed even if data compression is used as the data is directly received via SMbus interface.

As shown in all FIGS. 10A, 10B, 10C, the address list information including regular address or revised address information can be retrieved from the anti-fuse non-volatile memory device in two ways. One is to directly read the information and to output to a plurality of memory arrays (such as DRAM devices) coupled to the SMbus. Another way is to generate an address-match-table (AMT) (such as device 580 in FIG. 5) which can be uploaded to a temporary storage space, e.g., SRAM logic device. In a single-chip integrated device, the plurality of DRAM memory arrays (560 in FIG. 5) may have a dedicated spare memory group with their (revised) address information pre-stored in the SRAM logic device. Once certain cells in the plurality of DRAM memory arrays are found fault. The bad address information can be sent to the above integrated circuit device to perform (in-field) update operation by programming into the non-volatile memory and the bad address information can be further updated into SRAM for comparing the AMT stored there to determine which revised address of a particular spare cell can be used to replace the bad cell in the DRAM arrays.

Figure 12:
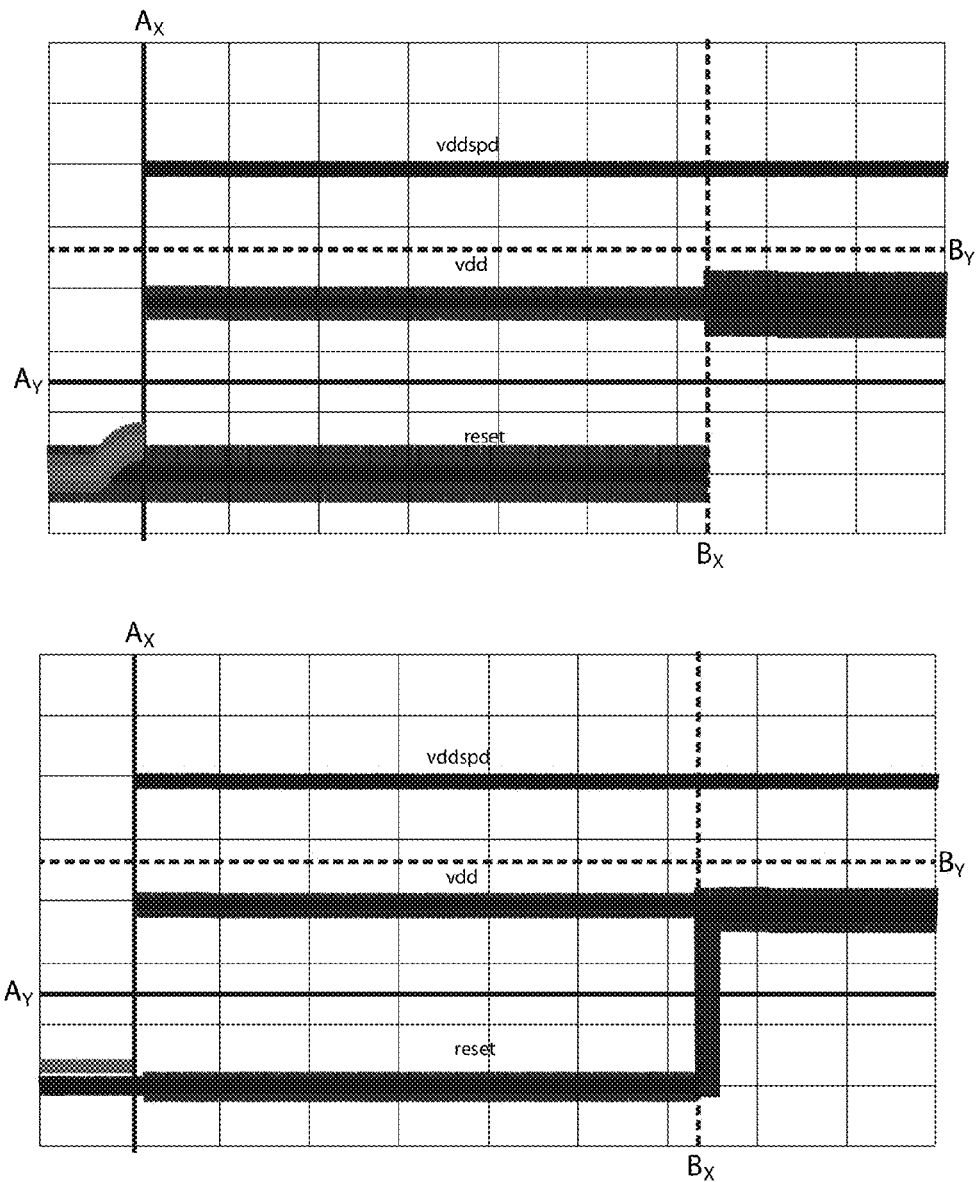
FIG. 12 illustrates exemplary diagrams of power-on sequencing examination of Address Match Table upload from the non-volatile memory according to an embodiment of the present invention.

In an embodiment, AMT upload is initiated by Power-on Power-good signal no matter the non-volatile memory is in a RCD (register chip) or a DRAM chip. In an example, the RCD or DRAM detects power ramp and generates internal Power-good signal. In another example, the RCD or DRAM initiates autonomous AMT load sequence upon a Power-good signal. In yet another example, the RCD or DRAM switches to "Normal operations" upon de-assertion of a Reset_n signal. Alternative, AMT load sequence can be initiated through SMbus and control-word. The rational is that systems typically provide long stabilization time for Power-on. FIG. 12 illustrates exemplary diagrams of power-on sequencing examination of Address Match Table upload from the non-volatile memory according to an embodiment of the present invention. Through the Power-on sequencing examination, system-specific Power-on sequencing specifications can be determined to seek guaranteed non-volatile random-access memory to AMT load time the examination shown in FIG. 12, the platform measurements according to embodiments of the present invention are performed for sanity check, including IBM x3650 M4—Intel Sandybridge, Dell PowerEdge R715—AMD Magny Cours, and HP DL360p—Intel Sandybridge.

Figure 11:
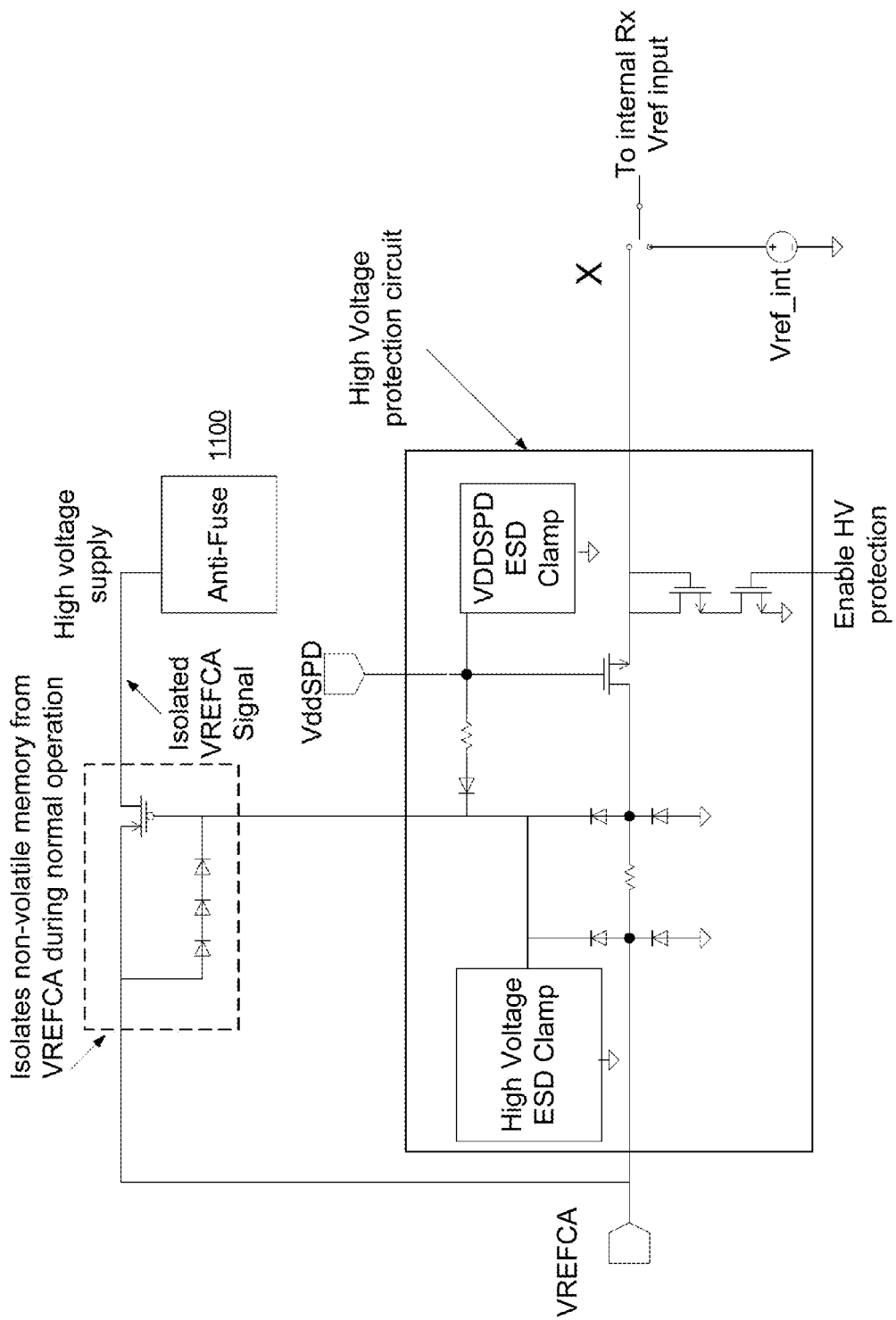
FIG. 11 illustrates a simplified diagram of a HV protection block and dual-purposing VREFCA pin in register chip according to an embodiment of the present invention.

The non-volatile memory can be built on a chip that is separate from the register chip. HV protection circuits can be used in the register chip (RCD) to protect RCD internal logic and allow the VREFCA pin or the isolated version of it to be shipped (routed external to RCD or through RCD) to the non-volatile chip which may be co-packaged with the register chip or sit as a stand alone device on the DIMM. FIG. 11 illustrates a simplified diagram of a HV protection block and dual-purposing VREFCA pin in register integrated circuit 1100 according to an embodiment of the present invention. This diagram is merely an example, which should not unduly limit the claims herein. One skilled in the art would recognize other variations, modifications, and alternatives. As shown, the high-voltage protection circuit includes a high-voltage electrostatic discharge (ESD) clamp circuit directly coupled to lock the high voltage node at VREFCA pin and a VDD serial presence detect ESD clamp circuit is coupled to VDDSPD pin and clamp a low voltage at node "X". The internal RX circuit can be safely run under Vref int voltage without interfered by the high voltage for non-volatile programming. Additionally, the HV protection circuit is also coupled to an isolation circuit that is designated for isolating non-volatile memory from VREFCA during its normal operation (i.e., the other function of the dual-purpose operations). A host controller will determine the passage of the VREFCA high-voltage signal to the non-volatile memory only when performing the needed non-volatile program operation.

FIG. 13 illustrates estimated capacity and area of the anti-fuse non-volatile memory according to embodiments of the present invention. This diagram is merely an example, which should not unduly limit the claims herein. One skilled in the art would recognize other variations, modifications, and alternatives. It has been proposed that the non-volatile memory is used for performing single-bit or very few bits programming operation. For the purpose of DRAM cell repair, the total size of non-volatile memory needs to be estimated and optimized for reducing chip silicon area. In general, chip area allocation includes a part for storing data, a part for error correction codes, a part for in-field repair or update, and for DIMM rework. Particularly, for storing data adding compression function would impact (surely reduce) the size of the non-volatile memory. For example, as shown in FIG. 13, about 0.5 mm² less area is needed when compression of the data is done. But adding the compression may lose the capability of back ground non-volatile memory programming. For in-field repair of cells in DRAM array, the non-volatile memory can allocate storage for 24 weak cells per DRAM array. If a certain DRAM cell becomes weak or bad in the field, the address location can be added to the list of weak cells in the field. In an embodiment, no post package repair needs to be done to DRAM; instead, the address table gets updated. In this way no need to keep track what DRAM repair resources are available. For DIMM rework, the non-volatile memory can allocate storage for 2 additional DRAMs.

FIG. 14 illustrates estimated program and read time for non-volatile memory according to an embodiment of the present invention. This diagram is merely an example, which should not unduly limit the claims herein. One skilled in the art would recognize other variations, modifications, and alternatives. As shown, single cell program time for the anti-fuse non-volatile memory is 50 □s and read time is only 50 ns. Total cell size is 2.54 Mb with compression and 3.23 Mb without compression corresponding to silicon area of 1.79 and 2.27 mm². AMT load time for information from a single macro chip is about 3.34 ms.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the description recited above is an example of the disclosure and that modifications and changes to the examples may be undertaken which are within the scope of the claimed disclosure. Therefore, the scope of the appended claims should be accorded the broadest interpretation so as to encompass all such modifications and similar arrangements, including a full scope of equivalents.

The invention claimed is:

1. A method of operating an integrated circuit device, the method comprising:
   receiving address information using an address input(s) configured to receive the address information from an address stream of a host controller;
   driving address information using an address output(s) configured to drive the address information, the address output(s) being coupled to a plurality of memory devices provided on a DIMM;
   using an address match table comprising a non-volatile memory device, the non-volatile memory device configured to store at least a revised address and a bad address of at least one of the plurality of memory devices, the revised address corresponding to a spare memory location;
   determining address information using a control module configured to determine the address information from the address stream from an address command bus coupled to the host controller during a run time operation, the control module configured to process each of the addresses from the address stream and determine whether each processed address matches with a stored address in the address match table to identify the bad address from the address stream and configured to replace the bad address from the address stream with the revised address of the spare memory location; and
   operating a multiplexer coupled to the address input(s) and coupled to the address output(s).

2. The method of claim 1 wherein the bad cell information is selected from a lower performing cell, a weak cell, or a faulty cell.

3. The method of claim 1 wherein the non-volatile memory device is selected from a Flash memory device.

4. The method of claim 1 wherein the bad cell information is location information, the location information comprising address information or off set information.

5. The method of claim 1 further comprising a charge pump coupled to the non-volatile memory device to program the non-volatile memory device to store the bad cell information.

6. The method of claim 1 wherein the non-volatile memory device is coupled to a high voltage source to program the non-volatile memory device.

7. The method of claim 1 further comprising an external high voltage pin coupled to the non-volatile memory device, the external high voltage pin being a VREFCA pin for a DDR3or DDR4DIMM.

8. The method of claim 1 wherein the non-volatile memory device is configured on a register integrated circuit device.

9. The method of claim 1 wherein the non-volatile memory device is configured on a register integrated circuit device, the register integrated circuit device comprising:
- a VREFCA pin;
- a high voltage control circuit coupled to the VREFCA pin and configured to provide a high voltage for programming the non-volatile memory device during a programming mode and configured with the VREFCA pin; and
- a plurality of volatile devices coupled to the register circuit memory device to form the DIMM.

10. The method of claim 1 further comprising a serial bus configured with the non-volatile memory device to program the non-volatile memory device, the serial bus comprising an SMBus.

11. The method of claim 1 further comprising a parallel interface bus configured with the non-volatile memory device to program the non-volatile memory device; and a temporary storage device, the temporary storage device being coupled the non-volatile memory device to buffer the bad cell information before programming the information into the non-volatile memory.

12. The method of claim 11 wherein the temporary storage device is selected from a register or an SRAM device; wherein the bad cell information is provided in a compressed mode.

13. The method of claim 1 further comprising a compression engine coupled to the non-volatile memory device to process the bad memory cell information; and a decompression engine coupled to the non-volatile memory device.

14. The method of claim 1 wherein the non-volatile memory device comprises a plurality of memory arrays, two or more of the memory arrays being configured to allow for a read or write operation in parallel upon a reset operation; and further comprising an on-chip clock coupled to the plurality of memory arrays.

* * * * *